(12) United States Patent
Lin et al.

(10) Patent No.: US 7,221,041 B2
(45) Date of Patent: May 22, 2007

(54) MULTI-CHIPS MODULE PACKAGE AND MANUFACTURING METHOD THEREOF

(75) Inventors: Chian-Chi Lin, Tainan (TW); Chih-Huang Chang, Tainan (TW)

(73) Assignee: Advanced Semiconductor Engineering, Inc., Kaoshiung (TW)

( * ) Notice: Subject to any disclaimer, the term of this patent is extended or adjusted under 35 U.S.C. 154(b) by 30 days.

(21) Appl. No.: 10/900,089

(22) Filed: Jul. 28, 2004

(65) Prior Publication Data
US 2005/0023667 A1 Feb. 3, 2005

(30) Foreign Application Priority Data
Jul. 29, 2003 (TW) .............................. 92120716 A

(51) Int. Cl.
*H01L 23/495* (2006.01)
(52) U.S. Cl. ...................... 257/666; 257/778
(58) Field of Classification Search ................ 257/777, 257/778, 784, 686, 775, 776, 666
See application file for complete search history.

(56) References Cited

U.S. PATENT DOCUMENTS
6,858,920 B2 * 2/2005 Hatauchi .................... 257/666

FOREIGN PATENT DOCUMENTS
JP 11219984 * 10/1999
TW 523887 3/2003

* cited by examiner

*Primary Examiner*—Howard Weiss
*Assistant Examiner*—(Vikki) Hoa B. Trinh
(74) *Attorney, Agent, or Firm*—Bacon & Thomas, PLLC

(57) ABSTRACT

A multi-chips module package comprises a lead frame, a first chip, a second chip, a plurality of electrically conductive wires and an encapsulation. The lead frame has a plurality of first leads, second leads and chip pads connecting to the first leads. The first chip is placed on the lead frame and electrically connected to the lead frame through the bumps connecting the bump-bonding pads and the chip pads and the first leads; the second chip is placed over the first chip and electrically connected to the lead frame through the wires connecting the wire-bonding pads to the second leads; and the encapsulation covers the first chip, the second chip, the lead frame, and the wires. In such a manner, it not only reduces the distance of transmitting the electrical signals from chips to the outside but also it can save cost due to the lead frame manufactured by a simple manufacturing processes. In addition, a manufacturing method of the multi-chips module package is provided.

15 Claims, 9 Drawing Sheets

MULTI-CHIPS MODULE PACKAGE AND MANUFACTURING METHOD THEREOF

BACKGROUND OF THE INVENTION

1. Field of Invention

This invention relates to a multi-chips module package. More particularly, the present invention is related to a multi-chips module package for integrating wire-bonded chip and flip chip therein and a manufacturing method thereof.

2. Related Art

As we know, in the semiconductor industries, the manufacture of semiconductors mainly comprises the manufacture of wafers and the assembly of integrated circuits devices. Therein, the integrated circuits (ICs) devices are completely formed by the processes of forming integrated circuits devices on the semiconductor wafers, sawing the wafers into individual integrated circuits devices, placing the individual integrated circuits devices on the substrates, electrically connecting the integrated circuits devices to the substrates respectively and encapsulating the integrated circuits devices and substrates to form a plurality of individual assembly packages. Due to the encapsulation covering the integrated circuits devices, the integrated circuits devices are able to be protected from the damp entering therein. In addition, the individual assembly packages may further provide external terminals for connecting to printed circuit board (PCB).

However, recently, integrated circuits packaging technology is becoming a limiting factor for the development in packaging integrated circuits devices of higher performance. Semiconductor package designers are struggling to keep pace with the increase in pin count, size limitations, low profile, and other evolving requirements for packaging and mounting integrated circuits.

Due to the assembly package in miniature and the integrated circuits operation in high frequency, MCM (multi-chips module) packages are commonly used in said assembly packages and electronic devices. Usually, said MCM package mainly comprising at least two chips encapsulated therein is provided, for example a processor unit, a memory unit and related logic units, to upgrade the electrical performance of said assembly package. In addition, the electrical paths between the chips in said MCM package are short so as to reduce the signal delay and save the reading and writing time.

Generally speaking, as shown in FIG. 1, it illustrates a cross-sectional view of a conventional multi-chips module package. Therein, said multi-chips module package 100 mainly comprises two chips 10 and 12, a substrate 16, an encapsulation 18, a plurality of electrically conductive wires 19. The substrate 16 has an upper surface for carrying the chips 10 and 12 which are located in parallel, and the chips 10 and 12 are electrically connected to the substrate 16 through said wires 19. In addition, the encapsulation 18 covers the chips 10 and 12, said wires 19 and a portion of the substrate 16. Hence, the area of the substrate 16 will be increased according to the numbers of the chips to be carried thereon so as to make the complete package larger and larger.

Accordingly, the semiconductor industries develop a stacked multi-chips package as shown in FIG. 2, which illustrates that the package mainly comprises a first chip 28, a second chip 26 and a substrate 20. Therein, the first chip is attached to the substrate 20 via an adhesive layer (not shown) and the second chip 26 is mounted onto the first chip 28. Besides, the upper surface of the substrate 20 further has a plurality of wire-bonding pads 22 and 24, and the first chip 28 and the second chip 26 are electrically connected to the substrate 20 through a plurality wires 29 wire-bonding to the wire-bond pads 22 and 24 respectively. Thus, the electrical signals can be transmitted to the external electronic devices, such as printed circuit boards, through a plurality of solder balls attached to the lower surface of the substrate 20. Moreover, an encapsulation 28 is formed to cover the first chip 28 and the second chip 26 to well protect the chips 26 and 28 from being moisture entering into the chips 26 and 28 to cause the chips 26 and 28 damaged.

Furthermore, as shown in FIG. 3, it illustrates a multi-chips stacked package patented in U.S. Pat. No. 5,973,403 to James M. Wark et.al entitled "Device and Method for stacking wire-bonded integrated circuit dice on flip-chip bonded integrated circuit dice" and said stacked package mainly comprises a flip chip 48, a wire-bonded chip 46, and a substrate 40. The flip chip 48 is bonded to the upper surface of the substrate 40 through a plurality of bumps 52 formed on the flip chip 48 connecting to the flip-chip pads 44 formed on the substrate 40; and the wire-bonded chip 46 is mounted to the back surface of the flip chip 48 and electrically connected to the wire-bonded pads 42 formed on the substrate 40. To be noted, the bumps 47 are formed on the flip chip 48 through typical bumping process and said bumps 47 can be solder bumps or gold bumps. Moreover, an encapsulation 49 is formed to cover the wire-bonded chip 46 and the flip chip 48 to well protect the chips 46 and 48 from being moisture entering into the chips 46 and 48 to cause the chips 46 and 48 damaged.

As mentioned above, the layout of the circuits arranged in the substrate applicable to such package as shown above is so complex that the cost of substrate is very expensive due to the complexity of manufacturing substrate. Moreover, the electrical traces are longer so that the impedance, the inductance and the noise will be increased to lower the electrical performance.

Moreover, a multi-chips stacked package patented in U.S. Pat. No. 5,973,403 to Lo et.al entitled "Flip Chip Type Quad Hat Non-Leaded Package" is incorporated into this application for reference. Therein, it discloses a flip chip package which mainly comprises a plurality of leads for taking as electrical terminals for electrically connecting the chip and the external electronic devices. To be noted, the leads have first surfaces and second surfaces, and the chip are bonded to the first surfaces through a plurality of bumps and the second surfaces are exposed out of the encapsulation to connect to said external electronic devices as mentioned above. However, the leads are easily separated from the encapsulation so as to be not able to well connect to external electronic devices.

Therefore, providing another multi-chips module package and manufacturing method thereof to solve the mentioned-above disadvantages is the most important task in this invention.

SUMMARY OF THE INVENTION

In view of the above-mentioned problems, the invention is to provide a multi-chips module package for integrating wire-bonded chip and flip chip therein and a manufacturing method thereof.

To achieve the above-mentioned, a multi-chips module package is provided, wherein the multi-chips module package mainly comprises a lead frame, a first chip, a second chip, a plurality of electrically conductive wires and an encapsulation. Therein, the lead frame has a plurality of first leads, second leads and chip pads connecting to the first leads; the first chip has a first active surface, a first back surface opposite to the first active surface, bump-bonding pads formed on the first active surface, wherein the first chip is placed on the lead frame and electrically connected to the lead frame through the bumps connecting the bump-bonding pads and the chip pads and the first leads; the second chip has a second active surface, a second back surface opposite to the second active surface, wire-bonding pads formed on the second active surface, wherein the second chip is placed over the first chip and electrically connected to the lead frame through the wires connecting the wire-bonding pads to the second leads; and the encapsulation covers the first chip, the second chip, the lead frame, and the wires.

Per this invention and mentioned above, the leads of the lead frame may have recesses formed thereon or the leads may have flat surfaces. In addition, the chip pads may have recesses for locking the bumps on the chip pads securely and takes as power connections or ground connections.

In summary, this invention is related to a multi-chips module package with a lead frame therein for electrically connecting the first chip and the second chip to external electronic devices. In such a manner, it not only reduces the distance of transmitting the electrical signals from chips to the outside so as to enhance electrical performance but also it can save cost due to the lead frame manufactured by a simple manufacturing processes.

BRIEF DESCRIPTION OF THE DRAWINGS

The invention will become more fully understood from the detailed description given herein below illustrations only, and thus are not limitative of the present invention, and wherein.

DETAILED DESCRIPTION OF THE INVENTION

The multi-chips module package according to the preferred embodiments of this invention will be described herein below with reference to the accompanying drawings, wherein the same reference numbers refer to the same elements.

Figure 1:
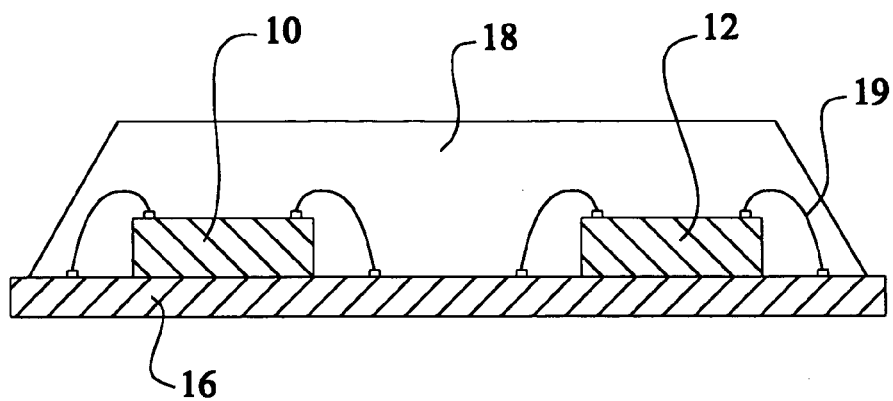
FIG. 1 is a cross-sectional view of the conventional multi-chips module package in a side-by-side type.
Figure 2:
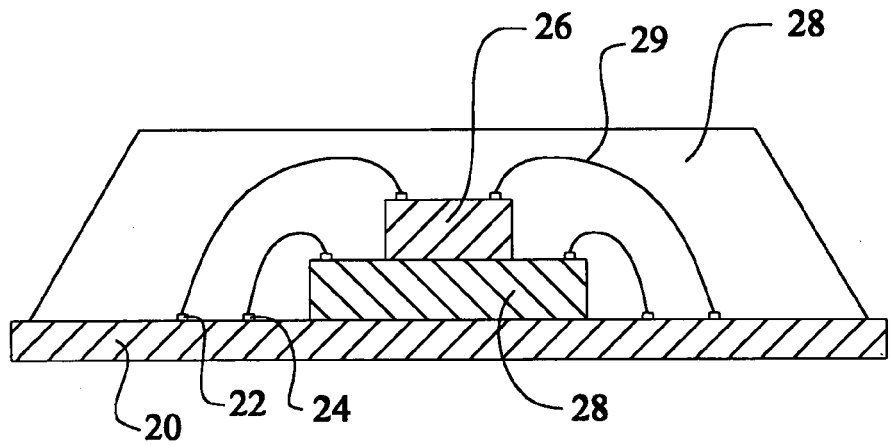
FIG. 2 is a cross-sectional view of another conventional multi-chips module package in a stacked type.
Figure 3:
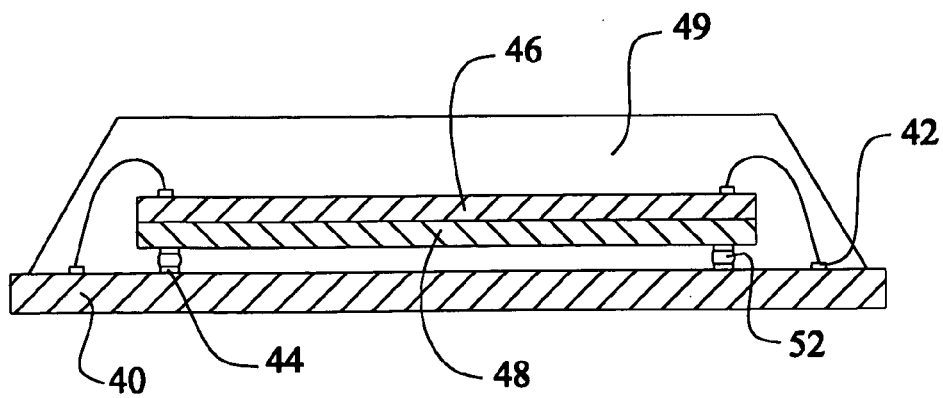
FIG. 3 is a cross-sectional view of another conventional multi-chips module package.
Figure 4:
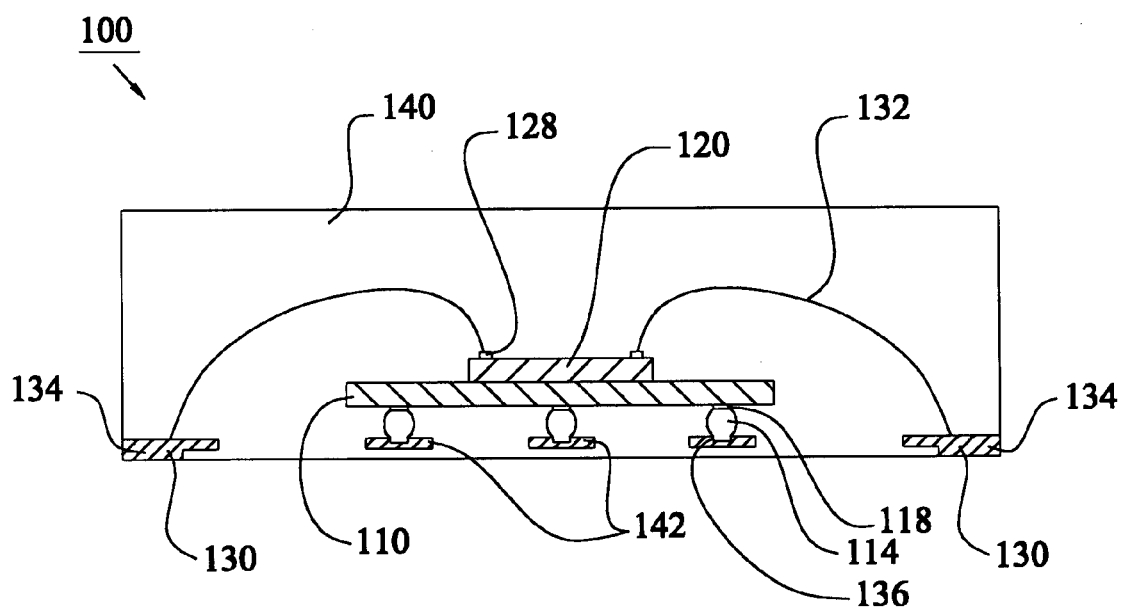
FIG. 4 is a cross-sectional view of multi-chips module package according to the first preferred embodiment of this invention.
Figure 5:
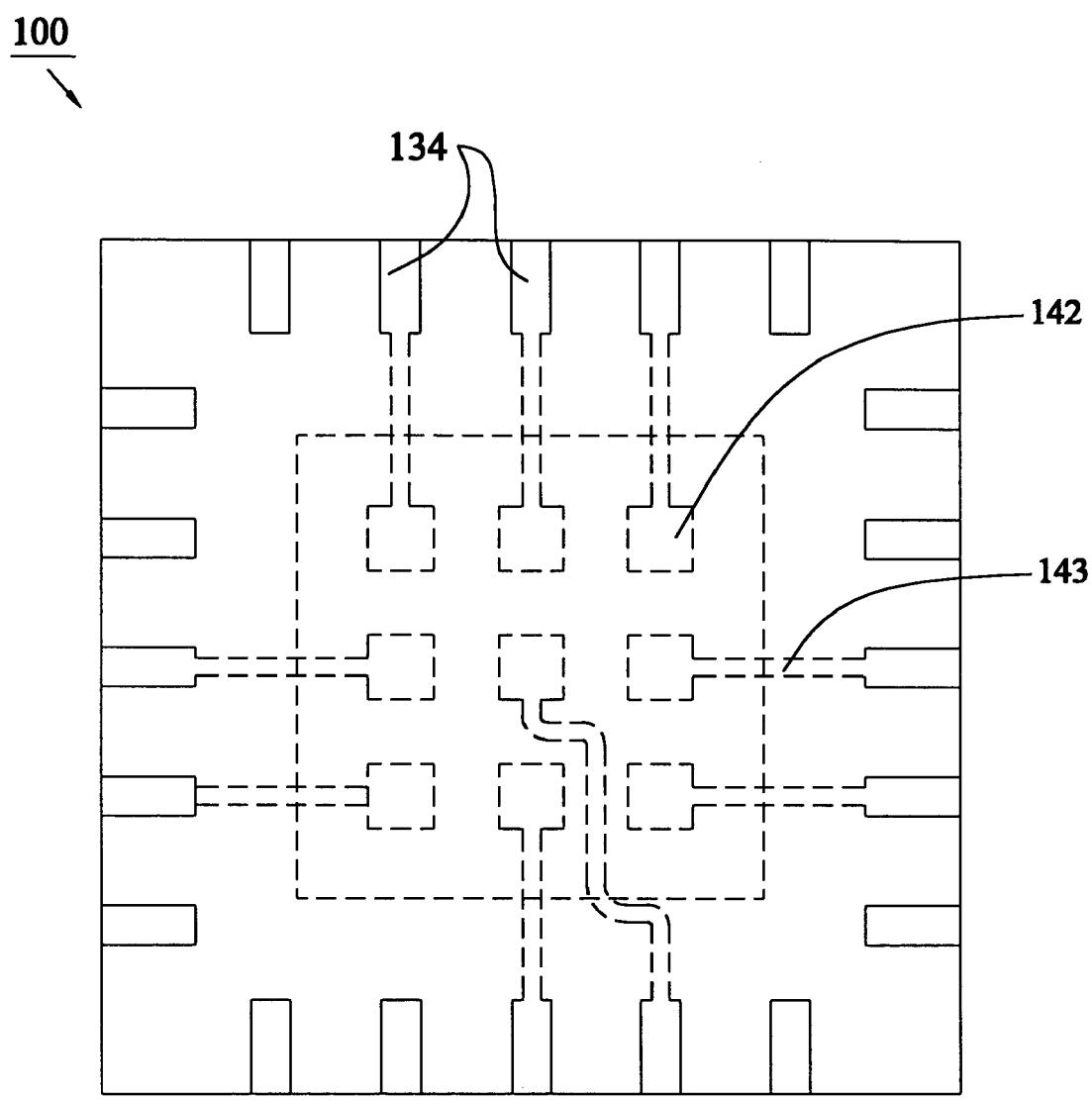
FIG. 5 is a bottom view of multi-chips module package according to the first preferred embodiment of this invention as shown in FIG. 4.

FIGS. 4 and 5 are enlarged cross-sectional views showing the cross-sectional view of a multi-chips module package according to the first preferred embodiment of this invention.

As shown in FIG. 4, the multi-chips module package 100 mainly comprises a first chip 110, a second chip 120 and a lead frame 130. Therein, the first chip 110 is flip-chip bonded to the lead fame 130 and the second chip 120 is disposed on the first chip 110 and electrically connected to the lead frame 130 through a plurality of electrically conductive wires.

To be noted, the lead frame 130 as mentioned above has a plurality of leads 134, chip pads 142 and tie bars 143, wherein at least one of the chip pads 142 is connected to one of the leads 134 through the corresponding tie bar 143 as shown in FIG. 4. Besides, the first chip 110 has a plurality of bump-bonding pads 118 formed on the active surface thereof and electrically connected to the leads 134 through a plurality of bumps 114 connecting to the chip pads 142 and the tie bars 143 connecting the leads 134 and the chip pads 142; and the second chip 120 is displace over the first chip 110, wherein the second chip 120 has a plurality of wire-bonding pads 128 formed thereon and electrically connected to the leads 134 through wires 132 connecting said leads 134 and the wire-bonding pads 128. Moreover, the encapsulation 140 encapsulates the first chip 110, the second chip 120, the wires 132, the bumps 114 and the chip pads 142, and portions of the leads 134 which are exposed out of the encapsulation 140 so as to be served as electrical terminals for connecting to external electronic devices. To be noted, the tie bars 143 are encapsulated in the encapsulation 140.

Referring to FIGS. 6 to 13, which are partially enlarged cross-sectional views showing the progression of steps for forming a multi-chips module package according to the first and other preferred embodiments of this invention.

Figure 6:
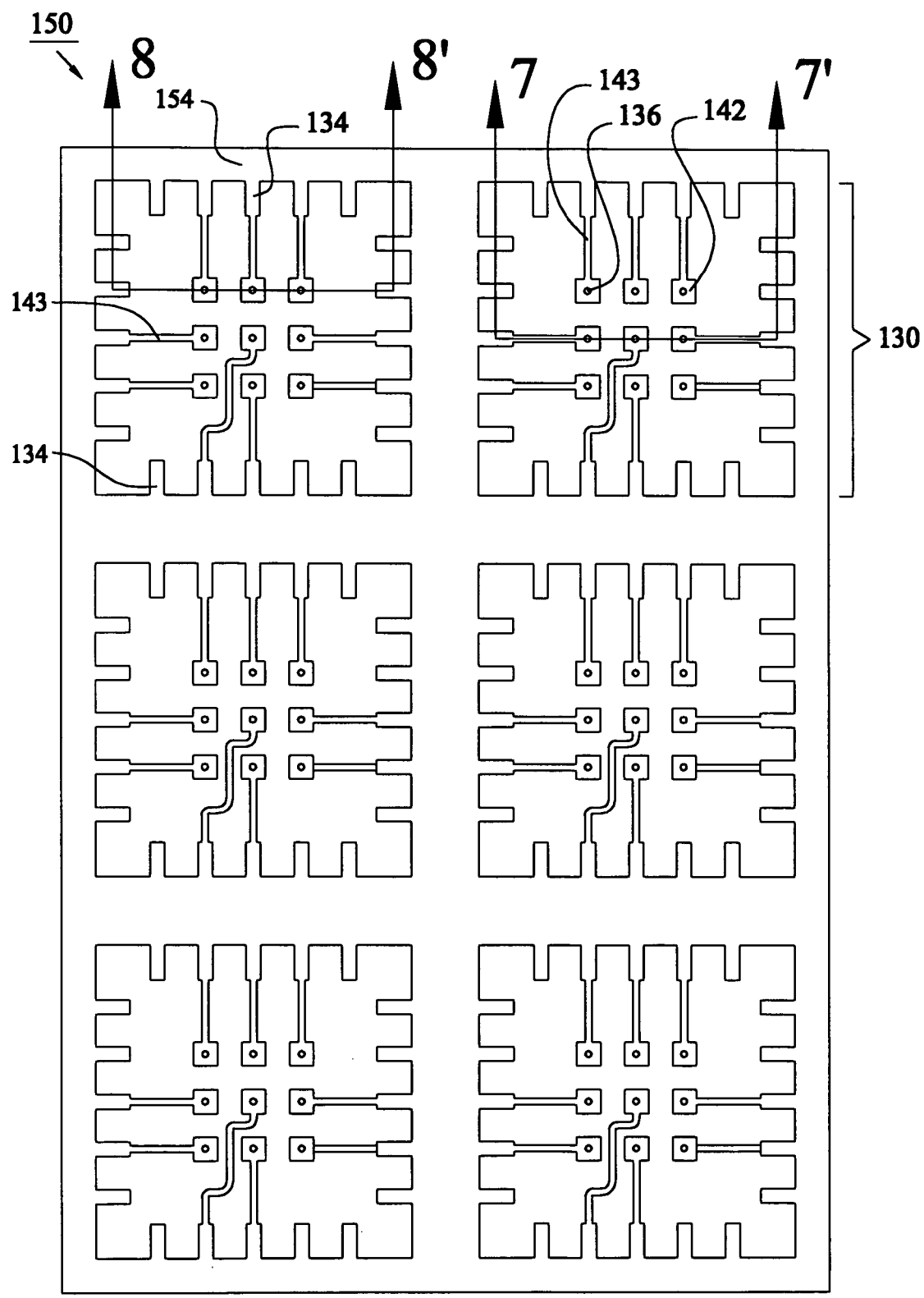
FIG. 6 is a top view of the lead frame strip having a plurality of lead frames being provided in the multi-chips module package according to the first preferred embodiment of this invention of FIG. 4.

As shown in FIG. 6, firstly, a lead frame strip 150 is provided, wherein the lead frame strip 150 has a frame 154 supporting a plurality lead frames 130. Each lead frame 130 has a plurality of leads 134 arranged at the four sides and connected to the frames 130 thereof. Each lead frame 130 further has a plurality chip pads 142 and a plurality tie bars 143 connecting the leads 134 to the corresponding chip pads 142. Each chip pad 136 has a recess 136 for filling a solder material, such as solder pastes or epoxy pastes. To be noted, the chip pads 142 may be directly connected to the frame 154 instead of being connected to the frame 154 through said leads 134.

Figure 7:
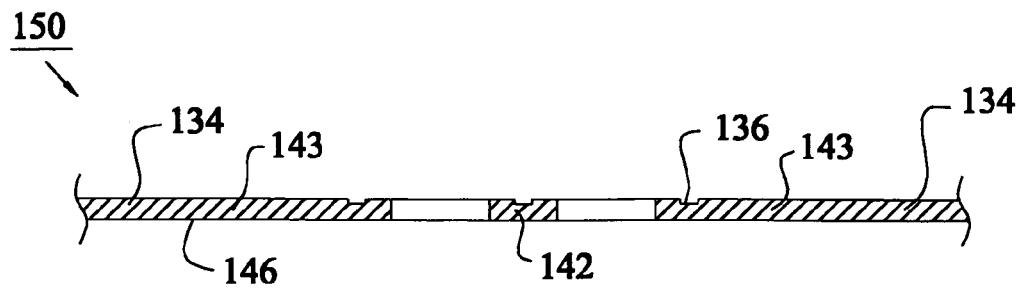
FIG. 7 is a cross-sectional view along line 7–7' of the lead frame according to the first preferred embodiment of this invention of FIG. 6.
Figure 8:
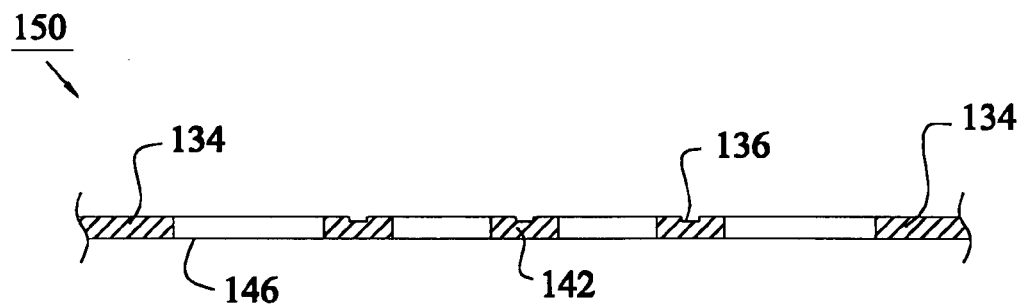
FIG. 8 is a cross-sectional view along line 8–8' of the lead frame according to the first preferred embodiment of this invention of FIG. 6.
Figure 9:
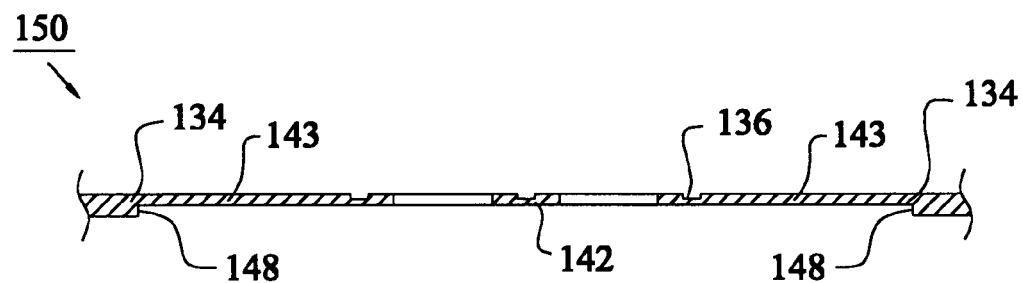
FIG. 9 is a cross-sectional view of the lead frame after the lead frame of FIG. 7 is performed half-etched process.
Figure 10:
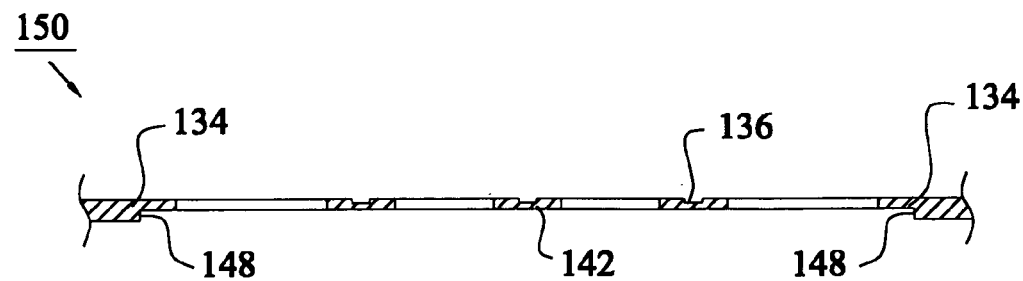
FIG. 10 is a cross-sectional view of the lead frame after the lead frame of FIG. 8 is performed half-etched process.
Figure 11:
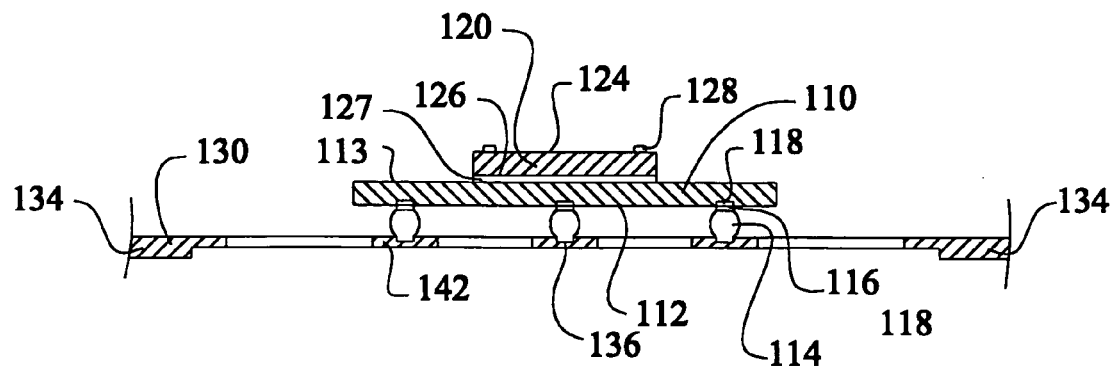
FIG. 11 is a cross-sectional view of a semi-finished multi-chips module package before encapsulating according to the first preferred embodiment of this invention.

Then, referring to FIGS. 7 and 8, typically, the lead frame strip 150 has an equable thickness. In other words, each lead frame 130 has substantially the same thickness with each other. Afterwards, the lead frame strip 150 is etched to form reentrant portions 148, such as a stepper, formed at the lower surfaces 146 of the lead frame 130 of the lead frame strip 150 as shown in FIGS. 9 and 10. The reentrant portions 148 may have the encapsulation well locked with the lead frame 130 so as to prevent the moisture from entering into the package 100. Referring to FIG. 11, the first chip 110 has a first active surface 112, a first back surface 113, a plurality of bumps 114, a plurality of bump-bonding pads 118 located on the first active surface 112 and a plurality of under bump metallurgy layers 116 formed on the bump-bonding pads 118. To be noted, the bumps 114 are attached to the under bump metallurgy layers 116 over the bump-bonding pads for electrically connecting to the outside, such as leads or chip pads of the lead frame 130; and are made of the materials of gold and solder materials. In addition, the bumps 114 of the first chip 110 is aligned with the recesses 136 of the chip pads 136 of the lead frame 130, and are secured to the chip pads 136 through the performing reflowing process.

Furthermore, a second chip 120 has a second active surface 124 and a second back surface 126, and the second chip 120 is attached to the first back surface 113 of the first chip 110 via an adhesive 127, such as epoxy resin or silver paste.

Figure 12:
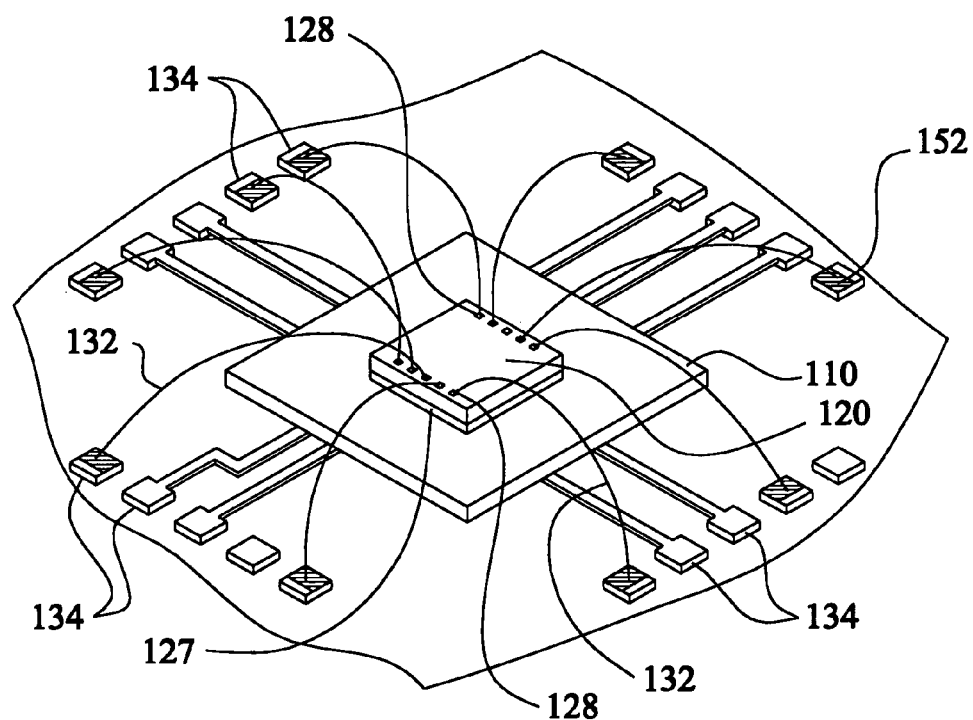
FIG. 12 is a three-dimensional figure illustrating a semi-finished multi-chips module package before encapsulating according to the first preferred embodiment of this invention.

Referring to FIG. 12, a plurality of electrically conductive wires 132 are bonded to the wire-bonding pads 128 of the second chip 120 and the leads 134 of the lead frame 130. To be noted, the leads 134 have gold layers 152 formed thereon for enhancing the connection of the wires 132 with the leads 134.

Figure 13:
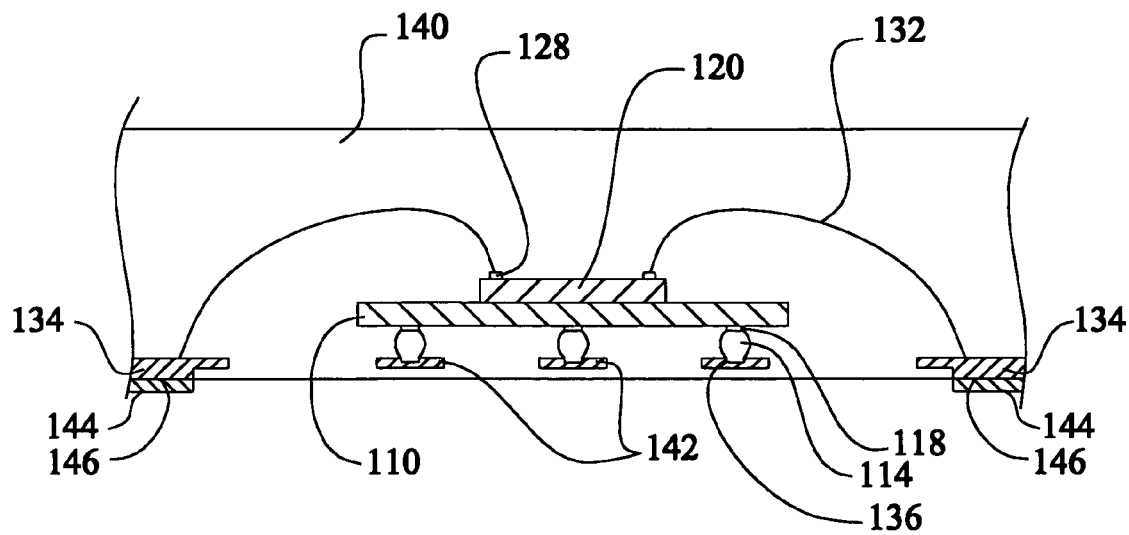
FIG. 13 is a schematic figure illustrating a semi-finished multi-chips module package with a tape attached thereto after encapsulating according to the first preferred embodiment of this invention.

Referring to FIG. 13, a plurality of taps or films 146 are attached to the lower surfaces of the leads 134 to prevent the mold compound from overflowing the lower surfaces of the leads 134 when the encapsulation process is performed. Finally, when the encapsulation process is completely performed, the tapes or films 146 are removed to leave the lower surfaces of the leads 134 exposed out of the encapsulation 140 to complete said multi-chips module package 100 as shown in FIG. 4 and FIG. 5.

Figure 14:
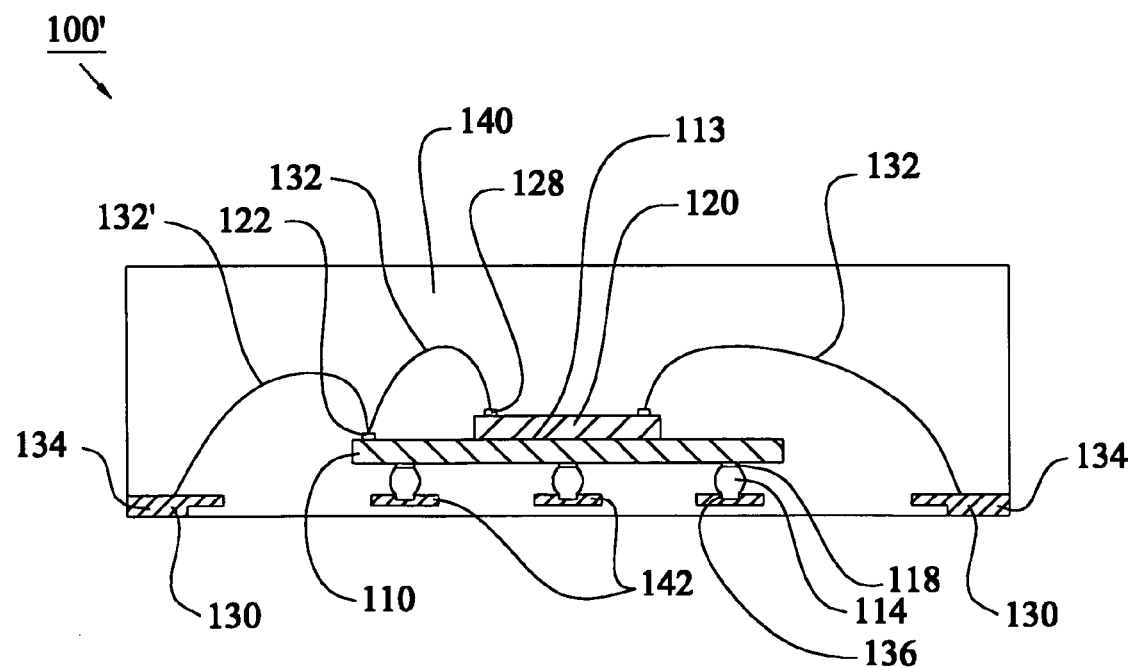
FIG. 14 is a cross-sectional view of multi-chips module package according to the second preferred embodiment of this invention.

Referring to FIG. 14, which illustrates another preferred embodiment of this invention. This embodiment shows a package 100' similar with the first one as shown above. To be noted, the difference of this embodiment from the first one is that there is a bridge pad 122 formed on the first back surface 113 of the firs chip 110. Therein, the second chip 120 and the leads 134 are electrically connected through the first wire 132 connecting the second chip 120 and the bridge pad 122 and the second wire 132' connecting the bridge pad 122 and the leads 134 so as to prevent the first wires and the second wires from being damaged due to the mold compound's sweeping.

Figure 15:
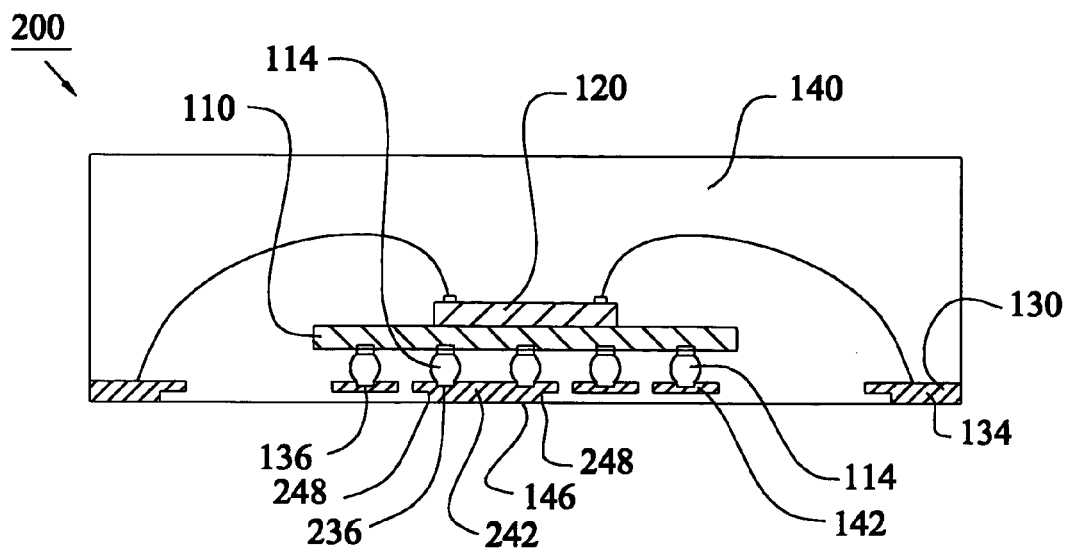
FIG. 15 is a cross-sectional view of multi-chips module package according to the third preferred embodiment of this invention.
Figure 16:
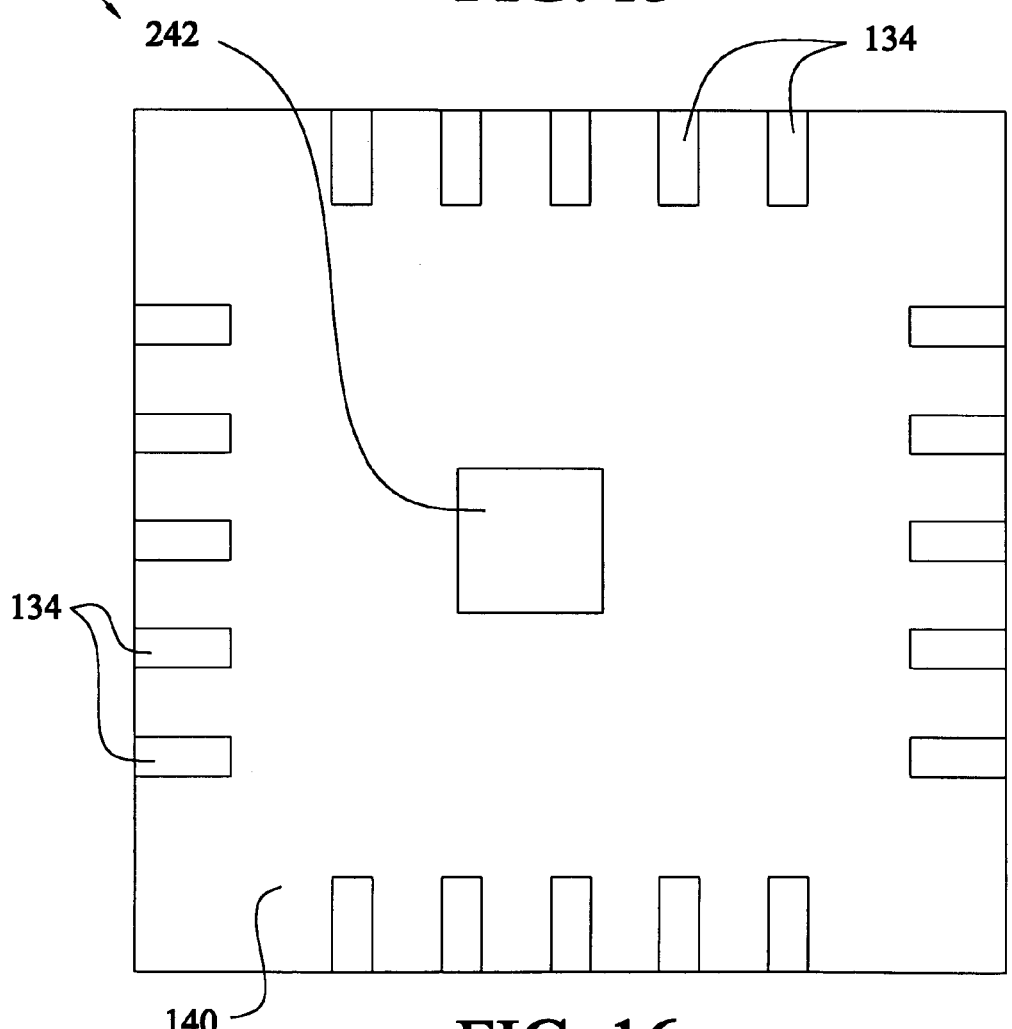
FIG. 16 is a bottom view of multi-chips module package according to the third preferred embodiment of this invention of FIG. 15.

Referring to FIG. 15 and FIG. 16, which illustrate a second preferred embodiment of this invention. This embodiment shows a package 200 similar with the first one as shown above. To be noted, the difference of this embodiment from the first one is that the lead frame 130 has a co-connected chip pad 242 with a plurality of recesses 236 formed thereon for carrying the bumps 114 of the firs chip 110. In addition, the co-connected chip pad 242 further has a plurality of reentrant portions 248 for having the encapsulation well locked with the lead frame 130. Besides, the lower surface of the co-connected chip pad 242 may be flat and exposed out of the encapsulation 140 for serving as a ground terminal or a power terminal.

Figure 17:
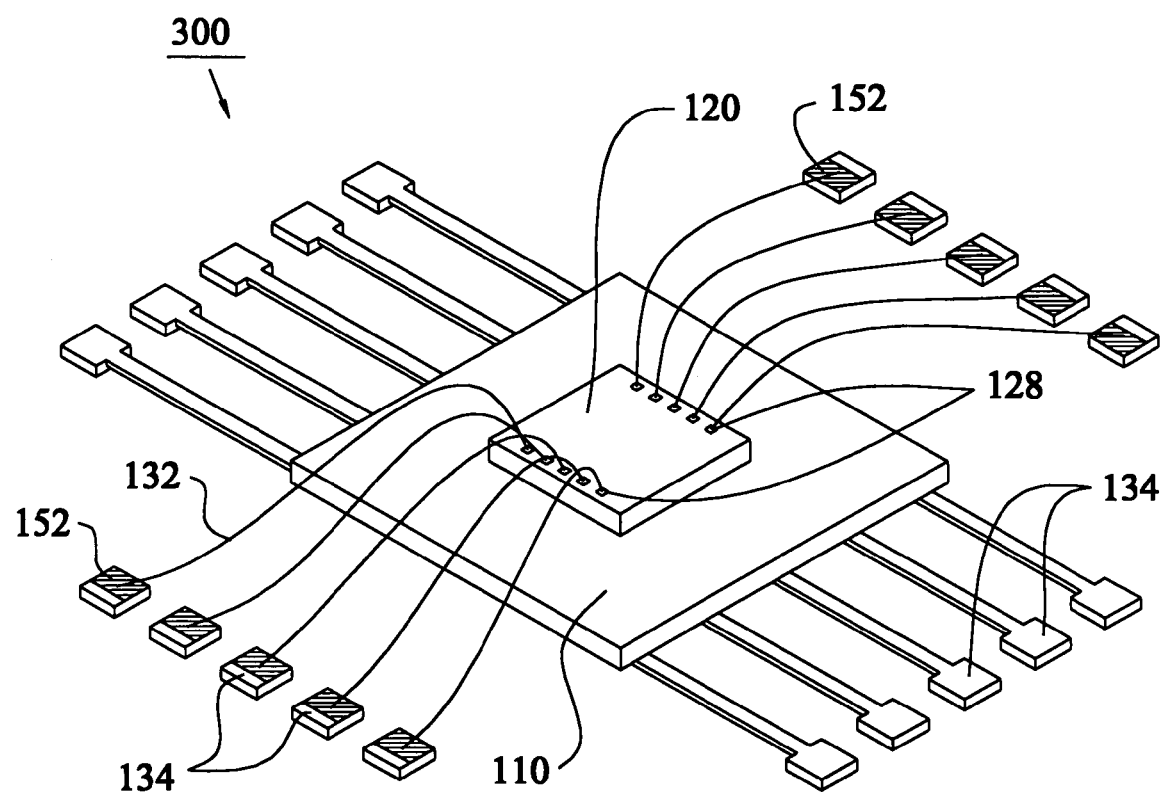
FIG. 17 is a three-dimensional figure illustrating a semi-finished multi-chips module package before encapsulating according to the third preferred embodiment of this invention.

Referring to FIG. 17, which illustrates a third embodiment of this invention. This embodiment shows a package 300 similar with the first embodiment as shown above. The chip pads 142 are connected to the leads 134 in a longitudinal direction and the second chip 120 is electrically connected to gold layer 152 of the leads 134 in a transversal direction orthogonal to the longitudinal direction.

As mentioned above, in this package, the lead frame is utilized to carry the chips, accordingly, it not only reduces the distance of transmitting the electrical signals from chips to the outside so as to enhance electrical performance but also can save cost due to the lead frame manufactured by a simple manufacturing processes.

Although the invention has been described in considerable detail with reference to certain preferred embodiments, it will be appreciated and understood that various changes and modifications may be made without departing from the spirit and scope of the invention as defined in the appended claims.

What is claimed is:

1. A multi-chips module package, comprising:
  a lead frame having a plurality of first leads, second leads and chip pads connecting to the first leads, wherein an upper surface of the first leads, an upper surface of the second leads, and an upper surface of the chip pads are in a common horizontal plane, and each chip pad has a recess which is recessed downward into the upper surface of the chip pad for accommodating a bump;
  a first chip having a first active surface, a first back surface opposite to the first active surface, a plurality of bump-bonding pads formed on the first active surface and that are opposing the chip pads and a plurality of bumps attached to the bump-bonding pads, the first chip disposed above the lead frame and attached to the lead frame through the bumps connecting to the chip pads, wherein the area of the first chip is larger than the total area of the chip pads;
  a second chip having a second active surface, a second back surface opposite to the second active surface, a plurality of wire-bonding pads formed on the second active surface, the second chip disposed over the first chip;
  a plurality of wires connecting the wire-bonding pads and the second leads; and
  an encapsulation covering the first chip, the second chip, and the lead frame, wherein portions of the first leads and portions of the second leads are exposed out of the encapsulation, and a plurality of tie bars connecting the first leads and the chip pads.

2. The multi-chips module package of claim 1, further comprising a solder material filled in the recess.

3. The multi-chips module package of claim 1, wherein the second leads have gold layers formed thereon.

4. The multi-chips module package of claim 1, wherein one of the first leads further has a reentrant portion formed thereon.

5. The multi-chips module package of claim 1, wherein one of the second leads further has a reentrant portion formed thereon.

6. The multi-chips module package of claim 1, wherein the first chip further has under bump metallurgy layers formed on the bump-bonding pads.

7. The multi-chips module package of claim 1, wherein the first chip further has a bridge pad disposed on the first back surface.

8. The multi-chips module package of claim 7, further comprising a first bridging wire connecting one of the bump-bonding pads and the bridge pad and a second bridging wire connecting the bridge pad and one of the second leads.

9. The multi-chips module package of claim 1, further comprising a co-connected chip pad electrically connecting to at least two of the bumps.

10. The multi-chips module package of claim 9, wherein a portion of the co-connected chip pad is exposed out of the encapsulation.

11. The multi-chips module package of claim 1, wherein the wires connect the wire-bonding pads and the first leads in a first direction and the chip pads connect the first leads in a second direction orthogonal to the first direction.

12. The multi-chips module package of claim 1, wherein the bumps are gold bumps.

13. The multi-chips module package of claim 1, wherein the bumps are solder bumps.

14. The multi-chips module package of claim 1, wherein the tie bars are encapsulated in the encapsulation.

15. The multi-chips module package of claim 1, wherein chip pads are encapsulated in the encapsulation.

* * * * *